United States Patent [19]
Virga et al.

[11] Patent Number: 5,150,088
[45] Date of Patent: Sep. 22, 1992

[54] STRIPLINE SHIELDING TECHNIQUES IN LOW TEMPERATURE CO-FIRED CERAMIC

[75] Inventors: Kathleen L. Virga, Redondo Beach; Craig Shoda, Torrance; Joseph N. Owens, Santa Monica, all of Calif.

[73] Assignee: Hughes Aircraft Company, Los Angeles, Calif.

[21] Appl. No.: 675,763

[22] Filed: Mar. 27, 1991

[51] Int. Cl.$^5$ .............................. H01P 3/08
[52] U.S. Cl. ........................... 333/238; 333/246
[58] Field of Search ............... 333/1, 12, 238, 246

[56] References Cited

U.S. PATENT DOCUMENTS

| | | | |
|---|---|---|---|
| 3,533,023 | 10/1970 | Friend et al. | 333/24.6 |
| 4,513,266 | 4/1985 | Ishihara | 333/238 |
| 4,758,922 | 7/1988 | Ishigaki et al. | 333/246 X |
| 4,845,311 | 7/1989 | Schreiber et al. | 333/1 X |
| 4,899,118 | 2/1990 | Polinski, Sr. | 333/246 |
| 4,904,968 | 2/1990 | Theus | 333/246 |

FOREIGN PATENT DOCUMENTS 131851 10/1979 Japan ....................... 333/238

OTHER PUBLICATIONS

Mason, *Stripline Transmission Line Isolation*, RCA Technical Notes, TN 1295, Jan. 28, 1982.

*Primary Examiner*—Paul Gensler
*Attorney, Agent, or Firm*—Leonard A. Alkov; Wanda K. Denson-Low

[57] ABSTRACT

Stripline shielding structures for stripline conductors implemented in unitized multilayer circuit structures are disclosed. The stripline structures generally include a lower ground plane below the stripline conductor, one or more embedded ground planes above the stripline conductor, and conductive elements laterally spaced from the stripline conductor for electrically connecting the ground planes. Resistive layers may be included above the embedded ground plane(s) for additional shielding.

11 Claims, 3 Drawing Sheets

STRIPLINE SHIELDING TECHNIQUES IN LOW TEMPERATURE CO-FIRED CERAMIC

BACKGROUND OF THE INVENTION

The disclosed invention is directed generally to hybrid multilayer circuit structures, and is directed more particularly to hybrid multilayer circuit structures having stripline shielding structures for shielding striplines embedded therein.

Hybrid multilayer circuit structures, also known as hybrid microcircuits, implement the interconnection and packaging of discrete circuit devices, and generally include a unitized multilayer circuit structure formed from a plurality of integrally fused insulating layers (e.g., ceramic layers) having conductor traces disposed therebetween. The discrete circuit devices (e.g., integrated circuits) are commonly mounted on the top insulating layer so as not to be covered by another insulating layer or on an insulating layer having die cutouts formed thereon to provide cavities for the discrete devices. Passive components such as capacitors and resistors can be formed on the same layer that supports the discrete devices, for example, by thick film processes, or they can be formed between the insulating layers, for example, also by thick film processes. Electrical interconnection of the conductors and components on the different layers is achieved with vias or holes appropriately located and formed in the insulating layers and filled with conductive via fill material, whereby the conductive material is in contact with predetermined conductive traces between the layers that extend over or under the vias.

Hybrid multilayer circuit structures are now being utilized for RF applications wherein stripline conductors are implemented in the multilayer structure, for example pursuant to screen printing.

A consideration with implementing stripline conductors in hybrid multilayer circuit structures is shielding.

SUMMARY OF THE INVENTION

It would therefore be an advantage to provide integral shielding structures for stripline conductors implemented in unitized multilayer circuit structures for confining the stripline fields within a region defined by the shielding structure in order to minimize the RF signal coupling to circuitry external to the region.

The foregoing and other advantages are provided by the invention in a stripline shielding structure that includes a lower ground plane below the stripline conductor, one or more embedded ground planes above the stripline conductor, and conductive elements laterally spaced from the stripline conductor for electrically connecting the ground planes. Resistive layers may be included above the embedded ground plane(s) for additional shielding.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
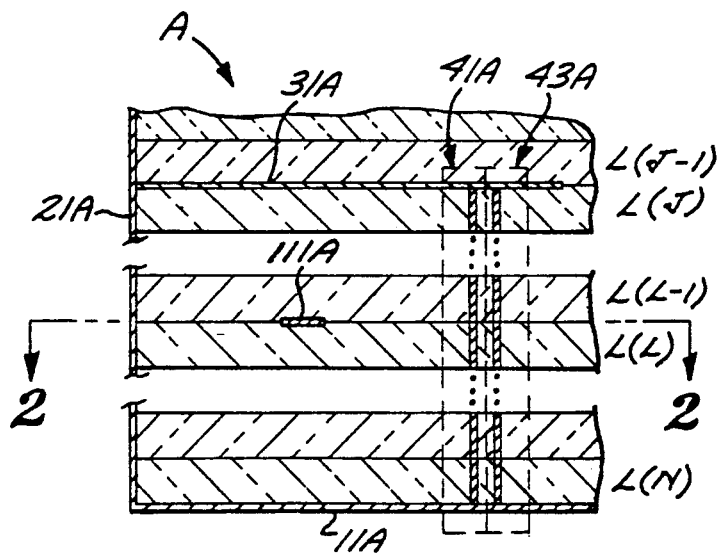
FIG. 1 is a schematic elevational sectional view of a shielding structure in accordance with the invention.

In the following detailed description and in the several figures of the drawing, like elements are identified with like reference numerals.

The stripline shielding structures in accordance with the invention are implemented in a unitized multilayer circuit structure that is utilized for interconnecting various discrete circuits mounted on the outside of the unitized structure. The unitized multilayer circuit structure is formed from a plurality of insulating layers (comprising ceramic, for example), conductive traces disposed between the layers, and conductive vias formed in the layers which together with any buried elements (e.g., elements formed on the top of an insulating layer and covered by an overlying insulating layer) are processed to form an integrally fused unitized multilayer structure. After the unitizing fabrication, appropriate metallization, including for example ground plane metallization, is applied to the outside of the unitized structure, and the discrete circuits are mounted and electrically connected.

Figure 2:
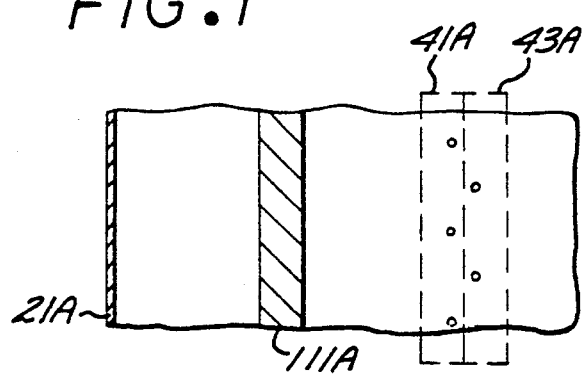
FIG. 2 is a schematic plan sectional view of the shielding structure of FIG. 1.

Referring now to FIGS. 1 and 2, set forth therein is a shielding structure A that includes a lower ground plane metallization layer 11A disposed on the bottom of the unitized multilayer circuit on the lower side of the insulating layer N. A side wall metallization layer 21A is formed on a side wall of the unitized structure and is in contact with the lower metallization layer ground plane 11A. Typically, the side wall metallization layer extends to the top of the unitized structure, and is contact with an embedded ground plane metallization layer 31A formed on the insulating layer J. The embedded ground plane metallization layer 31A extends from the side wall metallization layer 21A to beyond a stripline conductor 111A formed on the insulating layer L which is below the insulating layer J. The stripline conductor 111A is appropriately separated from the lower ground plane metallization layer 11A by intervening insulating layers, and is appropriately separated from the embedded ground plane metallization layer 31A by intervening insulating layers.

The embedded metallization layer 31A is electrically connected to the lower metallization ground plane 11A by first and second adjacent generally parallel rows 41A, 43A of conductive via columns that are shifted with respect to each other and located on the side of the stripline 111a furthest from the side wall metallization layer 21A. The adjacent generally parallel rows of conductive via columns generally follow the contour of the stripline conductor 111A.

Each conductive via column of the rows 41A, 43A comprises a column of electrically connected vias formed in the insulating layers J through N. The column can comprise axially aligned vias or staggered vias which are interconnected with conductor traces, for example. Whether axially aligned or staggered vias are utilized depends on factors such as those affecting the electrical, thermal or mechanical integrity of the unitized multilayer circuit structure.

The ground plane metallization layer 11A, the side wall metallization layer 21A, the embedded ground plane metallization layer 31A, and the rows of conductive via columns extend so as form a stripline channel that encloses the strip line 111A along its length, with the rows of conductive via columns generally following the contour of the stripline conductor 111A. Essentially, the ground planes are above and below the stripline conductor, the side wall metallization is on one side of the stripline conductor, and the conductive via columns are on the other side of the stripline conductor. These conductive elements surrounding the stripline conductor define a region about the stripline conductor and function to confine the stripline fields within that region in order to minimize the RF signal coupling to circuitry external to the region.

Figure 3:
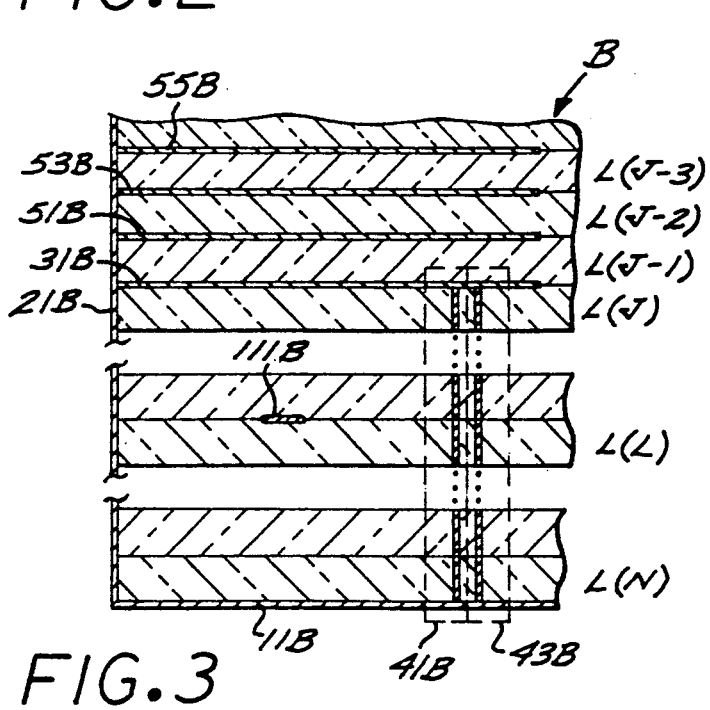
FIGS. 3-5 are schematic elevational sectional views of further shielding structures in accordance with the invention.

Referring now to FIG. 3, shown therein is a shield structure B which is essentially the shielding structure A of FIGS. 1 and 2, with the addition of resistive layers 51B, 53B, 55B formed on the insulating layers J-1, J-2, J-3 and overlying the embedded ground plane metallization layer 31B. The resistive layers 51B, 53B, 55B provide additional shielding and comprise resistive ink applied by screen printing, for example, and are preferably coextensive with the width and length of the stripline channel formed by the lower ground plane 11B, the sidewall metallization layer 21B, the embedded ground plane 31B, and the rows 41B, 43B of conductive vias. However, the resistive layer can be narrower than the width of the stripline channel if necessary to accommodate routing of other circuitry.

Figure 4:
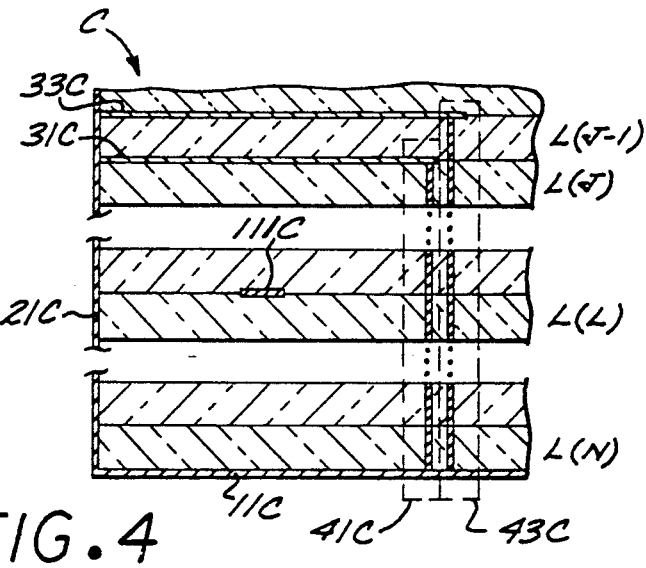

Referring now to FIG. 4, shown therein is a shielding structure C which includes a lower ground plane metallization layer 11C disposed on the bottom of the unitized multilayer circuit on the lower side of the insulating layer N. A side wall metallization layer 21C is formed on a side wall of the unitized structure and is in contact with the lower metallization layer ground plane 11C. Typically, the side wall metallization layer 21C extends to the top of the unitized structure, and is in contact with a first embedded ground plane metallization layer 31C formed on the insulating layer J and a second embedded ground plane metallization layer 33C formed on the insulating layer J-1. The first embedded ground plane metallization layer 31C extends from the side wall metallization layer 21C to beyond a stripline conductor 111C disposed on an insulating layer L which is below the insulating layer J. The stripline conductor 111C is appropriately separated from the lower ground plane metallization layer 11C by intervening insulating layers, and is appropriately separated from the embedded ground plane metallization layer 31C by intervening insulating layers.

The first embedded ground plane metallization layer 31C is electrically connected to the lower metallization ground plane 11C by a row 41C of conductive via columns which are on the side of the stripline conductor 111C furthest from the side wall metallization layer. The second embedded ground plane metallization layer 33C extends laterally from the side wall metallization layer 21C to beyond the first embedded ground plane metallization, and is electrically connected to the lower metallization ground plane 11C by a row 43C of conductive via columns adjacent and generally parallel to the first row 41C of conductive via columns. The adjacent generally parallel rows 41C, 43C of conductive via columns are shifted with respect to each other and generally follow the contour of the stripline conductor.

Each conductive via column of the rows 41C, 43C comprises a column of electrically connected vias formed in the insulating layers J-1 through N. The column can comprise axially aligned vias or staggered vias which are interconnected with conductor traces, for example. Whether axially aligned or staggered vias are utilized depends on factors such as those affecting the electrical, thermal, or mechanical integrity of the unitized multilayer circuit structure.

The ground plane metallization layer 11C, the side wall metallization layer 21C, the embedded ground plane metallization layers 31C, 33C, and the rows 41C, 43C of conductive via columns extend so as to form a stripline channel that encloses the strip line 111C along its length, with the rows of via columns generally following the contour of the stripline. Essentially, the first embedded ground plane above the stripline conductor, the lower ground plane below the stripline conductor, the side wall metallization on one side of the stripline conductor, and one row of the conductive via columns on the other side of the stripline conductor comprise a first shielding structure that defines a region about the stripline conductor and functions to confine the stripline fields within that region in order to minimize the RF signal coupling to circuitry external to the region. The second row of conductive via columns and the second ground plane form a separate and distinct shielding structure that encloses the first shielding structure, thereby increasing the shielding effect from that available from one structure alone.

Figure 4A:
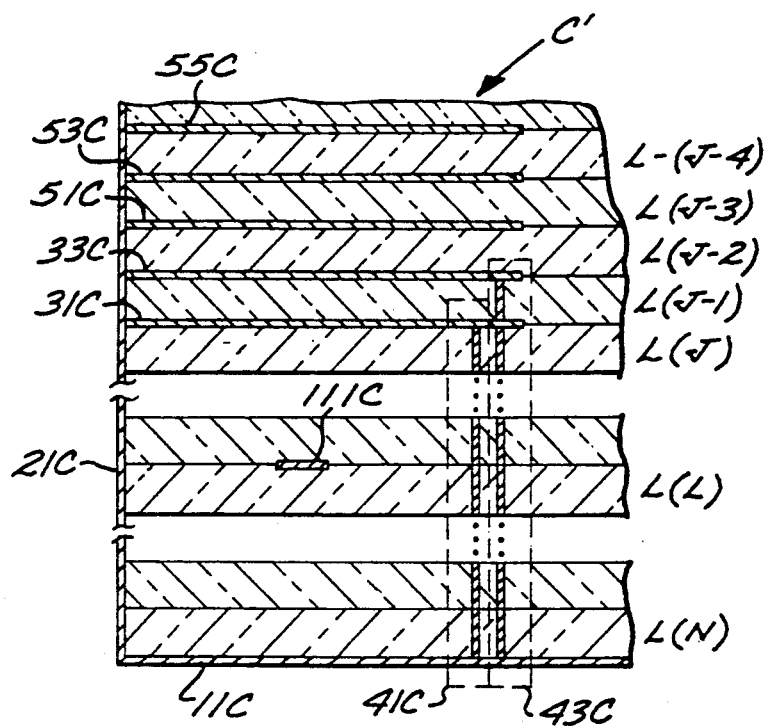

Referring now to FIG. 4A, shown therein is a shielding structure C' which is a variation of the shielding structure C of FIG. 4, and particularly includes resistive layers 51C, 53C, 55C overlying the embedded ground planes to provide for further shielding.

Figure 4B:
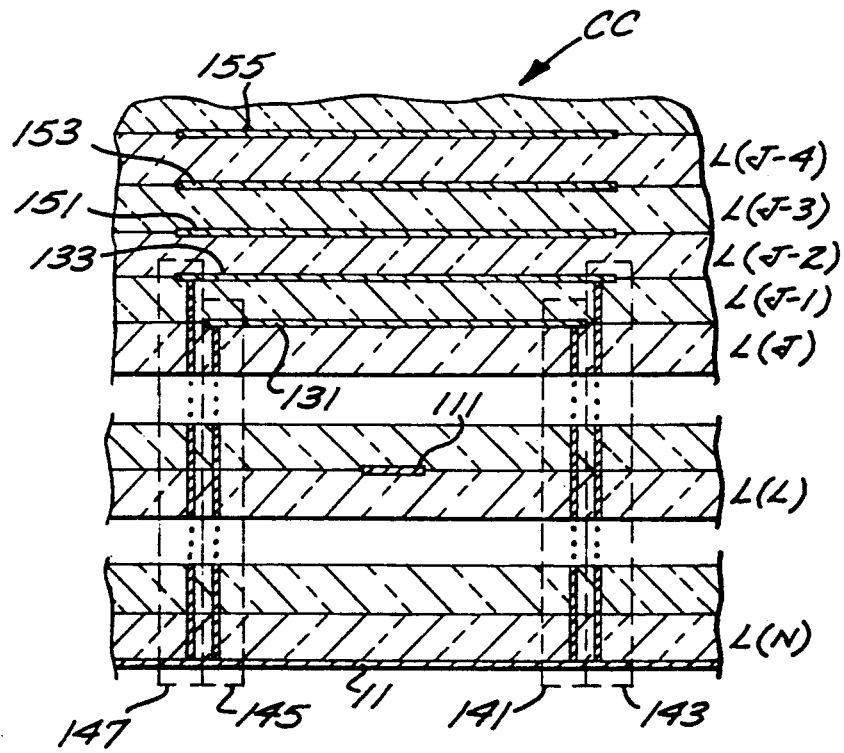

Referring now to FIG. 4B, shown therein is a shielding structure CC which is a variation of the shielding structures of FIGS. 4 and 4A. The shielding structure CC includes dual embedded ground planes 131, 133 which are electrically connected to the lower ground plane 11 by rows of conductive vias on each side of the stripline conductor 111. In particular, the embedded ground plane 131 is connected to the lower ground plane 11 by a row 141 on one side of the stripline conductor 111 and a row 145 on the other side of the stripline conductor. The embedded ground plane 133 is connected to the ground plane 11 by a row 143 that is on one side of the stripline conductor 111 and is adjacent and generally parallel to the row 141. The embedded ground plane 133 is further connected to the ground plane 11 by a row 147 that is one the other side of the stripline conductor 111 and is adjacent and generally parallel to the row 145. The shielding structure CC further includes resistive layers 151, 153, 155 overlying the embedded ground planes for providing further shielding.

Figure 5:
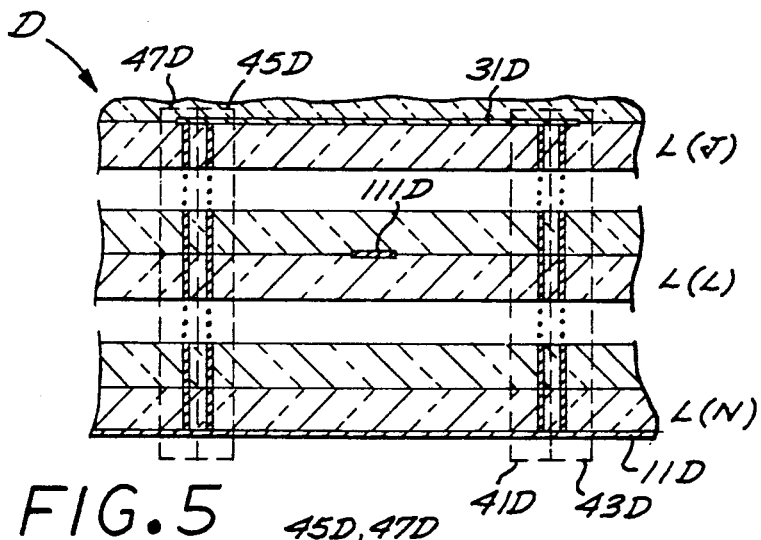
Figure 6:
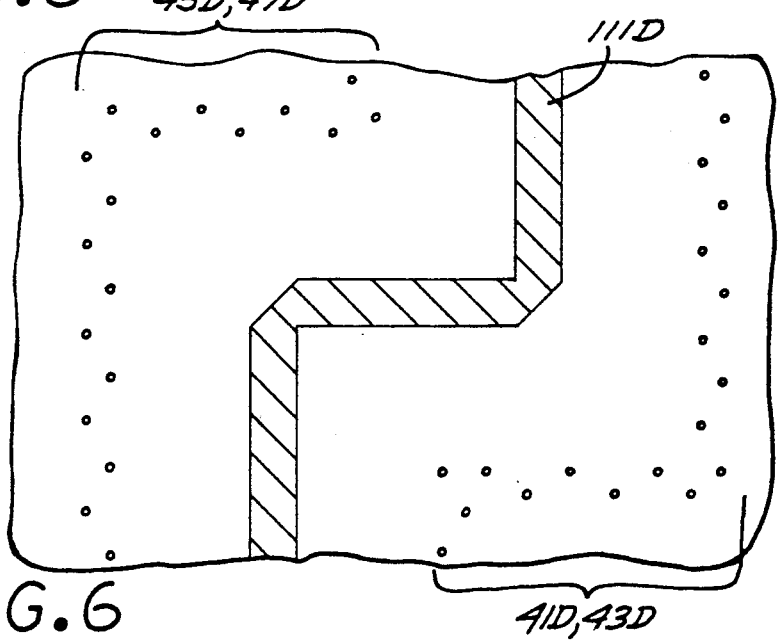
FIG. 6 is a schematic plan section view of the shielding structure of FIG. 5 illustrating how the conductive via rows of the shielding structure follow the contour of the stripline conductor being shielded.

From the foregoing, it should be appreciated that other shielding structures in accordance with the invention can be constructed from sub-structures of the foregoing shielding structures. An example would be a shielding structure having a ground plane electrically connected to the lower ground plane by dual rows of conductive vias, as illustrated by the shielding structure D of FIG. 5. The shielding structure D includes a lower ground plane metallization layer 11D disposed on the bottom of the unitized multilayer circuit on the lower side of the insulating layer N. An embedded ground plane metallization layer 31D formed on the insulating layer J extends laterally beyond the sides of a stripline conductor 111D. The embedded ground plane metallization layer 31D is electrically connected to the lower metallization ground plane 11D by adjacent generally parallel first and second rows 41D, 43D of conductive via columns which are on one side of the stripline conductor 111D, and by adjacent generally parallel third and fourth rows 45D, 47D of conductive via columns which are on the other side of the stripline conductor 111D. The adjacent generally parallel first and second rows 41D, 43D of conductive via columns are shifted relative to each other and generally follow the contour of the stripline conductor, and the adjacent generally parallel third and fourth rows 45D, 47D of conductive via columns are shifted relative to each other and generally follow the contour of the stripline conductor, as illustrated in the sectional plan view of FIG. 6.

The stripline conductor 111D is appropriately separated from the lower ground plane metallization layer 11D by intervening insulating layers, and is appropriately separated from the embedded ground plane metallization layer 31D by intervening insulating layers.

Each conductive via column of the rows 41D, 43D, 45D, 47D comprises a column of electrically connected vias formed in the insulating layers J through N. The column can comprise axially aligned vias or staggered vias which are interconnected with conductor traces, for example. Whether axially aligned or staggered vias are utilized depends on factors such as those affecting the electrical, thermal, or mechanical integrity of the unitized multilayer circuit structure.

The ground plane metallization layer 11D, the embedded ground plane metallization layer 31D, and the rows of conductive via columns extend so as to enclose the strip line 111D along its length, with the rows of conductive via columns generally following the contour of the stripline conductor 111D. Essentially, the ground planes are above and below the stripline conductor, and the dual rows of conductive via columns are on each side of the stripline conductor. These conductive elements surrounding the stripline conductor define a region about the stripline conductor and function to confine the stripline fields within that region in order to minimize the RF signal coupling to circuitry external to the region.

While the foregoing has described shielding structures for the example of a single stripline conductor, it should be appreciated that multiple stripline conductors can be enclosed with the shielding structures, including for example parallel strip lines which can be coupled or uncoupled. Also, the stripline conductor(s) being shielded can transition from one layer to another, in which case the embedded ground plane(s) can also be on multiple layers and appropriately interconnected by conductive vias.

The shielding structures in accordance with the invention effectively form waveguide like stripline channels, and the dimensions and spacing will depend on the particular application as well as the tolerances of the particular processing utilized to form the unitized multilayer circuit structure which implements the shielding structure. Generally, the spacing between vias in a row of conductive vias should be as close as practicable, for example less than $\frac{1}{8}$ of the wavelength of the highest frequency of interest, and sufficiently spaced so as to maintain mechanical integrity.

Ground plane spacing (i.e., spacing between the ground planes above and below the stripline conductor) is selected, for a given dielectric constant and characteristic impedance to be small enough to have a stripline conductor width that is sufficiently wide so that the required accuracy is within the tolerances of the process utilized to form the unitized multilayer circuit structure. In other words, for compactness, the ground plane spacing is made as small as practicable while maintaining required accuracy. RF loss considerations also be a factor in the ground plane spacing.

The channel width (i.e., the distance between the side wall metallization layer and the rows of conductive vias, or the distance between the rows of conductive vias on either side of the stripline conductor) must not be so narrow as to affect the characteristic impedance of the stripline conductor, nor so large as to excite the $TE_{10}$ mode, since the intent is to set up only the TEM mode. Thus, the channel width will depend upon the frequency of operation.

The stripline shielding structures in accordance with the invention are made, for example, pursuant to low temperature co-fired processing such as disclosed in "Development of a Low Temperature Co-fired Multilayer Ceramic Technology," by William A. Vitriol et al., 1983 ISHM Proceedings, pages 593-598; "Processing and Reliability of Resistors Incorporated Within Low Temperature Co-fired Ceramic Structures," by Ramona G. Pond et al., 1986 ISHM Proceedings, pages 461-472; and "Low Temperature Co-Fireable Ceramics with Co-Fired Resistors," by H. T. Sawhill et al., 1986 ISHM Proceedings, pages 268-271.

In accordance with low temperature co-fired processing, vias are formed in a plurality of green thick film tape layers at locations defined by the desired via configurations of the desired multilayer circuit. The vias are filled with the appropriate fill material, for example, by screen printing. Conductor metallization for conductive traces including the stripline conductors and the embedded ground planes are then deposited on the individual tape layers by screen printing, for example, and materials for forming passive components are deposited on the tape layers. The tape layers are laminated and fired at a temperature below 1200 degrees Celsius (typically 850 degrees Celsius) for a predetermined length of time which drives off organic materials contained in the green ceramic tape and forms a solid ceramic substrate. External metallization including the lower ground plane metallization and any side wall metallization can then be applied by known techniques.

Shielding structures in accordance with the invention can also be implemented with other technologies for forming unitized multilayer circuit structures, including for example high temperature co-fired ceramics, hard ceramic multilayer single firing technology, and a laminated soft substrate approach.

The foregoing has been a disclosure of stripline shielding structures for stripline structures implemented in unitized multilayer circuit structures, wherein the shielding structures are advantageously integrally formed with the stripline structures for confining stripline fields within a region defined by the shielding structure in order to minimize coupling to circuitry external to the region.

Although the foregoing has been a description and illustration of specific embodiments of the invention, various modifications and changes thereto can be made by persons skilled in the art without departing from the scope and spirit of the invention as defined by the following claims.

What is claimed is:

1. A stripline shielding structure in a unitized multilayer circuit structure having a plurality of insulating layers, a bottom surface, and a sidewall surface for shielding a stripline conductor, the shielding structure comprising:

a lower ground plane metallization layer formed on the bottom surface of the unitized multilayer circuit structure located below the stripline conductor;

an embedded ground plan metallization layer formed between predetermined insulating layers of the utilized multilayer circuit structure located above the stripline conductor;

first conductive means electrically connected between said lower ground plane and said embedded ground plane metallization layers, said first conductive means disposed on one side of the stripline and extending along the length thereof;

second conductive means electrically connected between said lower ground plane and said embedded ground plane metallization layers, said second conductive means disposed on the other side of the stripline and extending along the length thereof; and resistive layers formed between predetermined insulating layers and overlying said embedded ground plane metallization layer.

2. The shielding structure of claim 1 wherein said first conductive means comprises a metallization layer disposed on a sidewall of the unitized multilayer circuit structure, and said second conductive means comprises two rows of conductive vias.

3. The shielding structure of claim 1 wherein said first conductive means comprises two rows of conductive vias, and said second conductive means comprises two rows of conductive vias.

4. The shielding structure of claim 1 wherein said first conductive means comprises a metallization layer disposed on a sidewall of the unitized multilayer circuit structure, and said second conductive means comprises two rows of conductive vias.

5. The shielding structure of claim 1 wherein said first conductive means comprises two rows of conductive vias, and said second conductive means comprises two rows of conductive vias.

6. A stripline shielding structure in a unitized multilayer circuit structure having a plurality of insulating layers, a bottom surface, and a sidewall surface for shielding a stripline conductor, the shielding structure comprising:

a lower ground plane metallization layer formed on the bottom surface of the unitized multilayer circuit structure located below the stripline conductor;

a first embedded ground plane metallization layer formed between predetermined insulating layers of the unitized multilayer circuit structure located above the stripline conductor;

a second embedded ground plane metallization layer disposed above said first embedded ground plane metallization layer and separated therefrom by an insulating layer;

first conductive means electrically connected between said lower ground plane and said embedded ground plane metallization layers, said first conductive means disposed on one side of the stripline and extending along the length thereof; and second conductive means electrically connected between said lower ground plane and said embedded ground plane metallization layers, said conductive means disposed on the other side of the stripline and extending along the length thereof.

7. The shielding structure of claim 6 wherein said first conductive means comprises a sidewall metallization layer, and said second conductive means comprises first and second adjacent rows of conductive vias wherein said first row of conductive vias is connected to said first embedded ground plane metallization layer and said second row of conductive vias is connected to said second embedded ground plane metallization layer.

8. The shielding structure of claim 6 wherein said first conductive means comprises a first group of two adjacent rows of conductive vias wherein one row of said first group of two rows is connected to said first embedded ground plane metallization layer and the other row is connected to said second embedded ground plane metallization layer, and said second conductive means comprises a second group of two adjacent rows of conductive vias wherein one row of said second group of two rows is connected to said first embedded ground plane metallization layer and the other row of said second group of two rows is connected to said second embedded ground plane metallization layer.

9. The shielding structure of claim 6 further including resistive layers formed between predetermined insulating layers and disposed above said second embedded ground plane metallization layer.

10. The shielding structure of claim 9 wherein said first conductive means comprises a sidewall metallization layer, and said second conductive means comprises first and second adjacent rows of conductive vias wherein said first row of conductive vias is connected to said first embedded ground plane metallization layer and said second row of conductive vias is connected to said second embedded ground plane metallization layer.

11. The shielding structure of claim 9 wherein said first conductive means comprises a first group of two adjacent rows of conductive vias wherein one row of said first group of two rows is connected to said first embedded ground plane metallization layer and the other row is connected to said second embedded ground plane metallization layer, and said second conductive means comprises a second group of two adjacent rows of conductive vias wherein one row of said second group of two rows is connected to said first embedded ground plane metallization layer and the other row of said second group of two rows is connected to said second embedded ground plane metallization layer.

* * * * *